(12) United States Patent
Lee et al.

(10) Patent No.: US 9,076,772 B2
(45) Date of Patent: Jul. 7, 2015

(54) SEMICONDUCTOR DEVICE AND METHOD OF FABRICATING THE SAME

(71) Applicants: SK hynix Inc., Icheon-si (KR); SEOUL NATIONAL UNIVERSITY R&DB FOUNDATION, Seoul (KR)

(72) Inventors: Jong Ho Lee, Seoul (KR); Kyung Do Kim, Seoul (KR)

(73) Assignees: SK HYNIX INC., Icheon (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 14/166,722

(22) Filed: Jan. 28, 2014

(65) Prior Publication Data

US 2014/0210058 A1 Jul. 31, 2014

(30) Foreign Application Priority Data

Jan. 28, 2013 (KR) .................. 10-2013-0009518

(51) Int. Cl.
*H01L 23/535* (2006.01)
*H01L 23/48* (2006.01)

(52) U.S. Cl.
CPC ..... *H01L 23/481* (2013.01); *H01L 2224/16145* (2013.01); *H01L 2224/16225* (2013.01); *H01L 2924/15311* (2013.01); *H01L 2924/13091* (2013.01); *H01L 2924/1305* (2013.01)

(58) Field of Classification Search
CPC .................................................. H01L 23/481
USPC ....................................................... 257/773
See application file for complete search history.

(56) References Cited

U.S. PATENT DOCUMENTS

| | | | | |
|---|---|---|---|---|
| 5,021,355 A | * | 6/1991 | Dhong et al. ................ | 438/270 |
| 2006/0118850 A1 | * | 6/2006 | Otani et al. ................. | 257/301 |
| 2008/0153226 A1 | * | 6/2008 | Mokhlesi ..................... | 438/259 |
| 2009/0315147 A1 | | 12/2009 | Saito et al. | |
| 2010/0237386 A1 | * | 9/2010 | Lin et al. ..................... | 257/173 |
| 2011/0095367 A1 | * | 4/2011 | Su et al. ...................... | 257/355 |
| 2011/0241185 A1 | * | 10/2011 | Koester et al. .............. | 257/659 |
| 2011/0272561 A1 | * | 11/2011 | Sanfilippo et al. ......... | 250/214.1 |
| 2012/0061795 A1 | * | 3/2012 | Yen et al. .................... | 257/516 |
| 2012/0211829 A1 | * | 8/2012 | Bartley et al. ............... | 257/332 |
| 2012/0326319 A1 | | 12/2012 | Yu | |
| 2013/0099312 A1 | * | 4/2013 | Dao et al. .................... | 257/335 |
| 2013/0147057 A1 | * | 6/2013 | Horng et al. ................ | 257/774 |
| 2014/0061936 A1 | * | 3/2014 | Moroz et al. ................ | 257/774 |
| 2014/0073133 A1 | * | 3/2014 | Kahn et al. .................. | 438/667 |
| 2014/0118059 A1 | * | 5/2014 | Kim et al. .................... | 327/535 |

FOREIGN PATENT DOCUMENTS

KR  10-2011-0006946 A  1/2011

* cited by examiner

*Primary Examiner* — George Fourson, III

(57) ABSTRACT

A semiconductor device and a method of fabricating the same. The semiconductor device includes a semiconductor substrate having a P-type region, on at least one main surface of which integrated circuits are formed; one or more via electrodes inserted into the P-type region of the semiconductor substrate; a dielectric layer formed between the semiconductor substrate and the via electrodes; an N-type region, which is formed in the semiconductor substrate to contact a portion of the dielectric layer and to expose other portion of the dielectric layer; and a power circuit, which is electrically connected to the N-type region and apply a bias voltage or a ground voltage thereto, such that electric signals flowing in the via electrodes form an inversion layer on a surface of the semiconductor substrate facing the exposed portion of the dielectric layer.

14 Claims, 9 Drawing Sheets

SEMICONDUCTOR DEVICE AND METHOD OF FABRICATING THE SAME

CROSS-REFERENCES TO RELATED APPLICATION

This application claims the benefit of Korean Patent Application No. 10-2013-0009518, filed on Jan. 28, 2013, in the Korean Intellectual Property Office, the disclosure of which is incorporated herein in its entirety by reference.

BACKGROUND

1. Technical Field

The present invention relates to semiconductor technology, and more particularly, to semiconductor device and method of fabricating the same.

2. Related Art

In the market, demands for higher performance and higher capacity of electronic systems are increasing, and, to this end, semiconductor integrated circuits have been continuously miniaturized so as to increase density of integration. A semiconductor memory device, such as a dynamic random access memory (DRAM), or a microprocessor, such as a CPU, requires a large number of transistors in proportional to the density of integration thereof, and the density of integration of such devices has been obtained by reducing channel lengths of MOSFETs and contact density for electric connections. However, such an approach is at the limit due to device malfunctions based on short channel effect and difficulty of wiring process due to reduced contact size. Thus, an alternative technique for increasing integration is required.

As such an alternative technique, researches are being actively made on techniques for increasing density of integration without reducing sizes of semiconductor chips by fabricating a 3-dimensional (3D) semiconductor device by stacking a plurality of semiconductor chips. Examples of the techniques include a 3-dimensional integrated circuit (3DIC) and a through substrate/silicon vias (TSV) applicable to stacked chips. The TSV is a conductor which penetrates through a semiconductor chip from the top surface to the bottom surface to provide an electric connection between stacked semiconductor chips.

The TSV has larger diameter and height as compared to those of wirings or vias commonly applied to a semiconductor device and a relatively large current flows therethrough. As a result, an interference or crosstalk may occur between the TSV and another integrated circuit adjacent to the TSV in a semiconductor chip. Due to the interference, speed and operation characteristics of an adjacent integrated circuit may be deteriorated and power consumption may increase. Particularly, if the integrated circuit is an analog circuit or a circuit operating at a high frequency, the interference significantly affects device performance.

SUMMARY

The present invention provides a semiconductor device having a through via structure for minimizing or eliminating interferences with adjacent integrated circuits or noises therefrom due to electric signals flowing in TSVs. The present invention also provides a method of fabricating the semiconductor device.

According to an aspect of the present invention, there is provided a semiconductor device including a semiconductor substrate having a P-type region and at least one surface with integrated circuits formed thereon; at least one via electrode extending in the semiconductor substrate; a dielectric layer formed between the semiconductor substrate and the at least one via electrodes, the dielectric layer including a first portion, and a second portion that faces the P-type region of the semiconductor substrate; an N-type region formed in the semiconductor substrate to contact the first portion of the dielectric layer; and a power circuit, which is electrically connected to the N-type region and applies a bias voltage or a ground voltage thereto, such that electric signals flowing in the via electrodes form an inversion layer on a surface of the P-type region of the semiconductor substrate facing the second portion of the dielectric layer.

The P-type region of the semiconductor substrate may include an entire body, wells, pockets, halos or a combination thereof. The at least one via electrode may be formed in an active region of the semiconductor substrate. The at least one via electrode may include doped poly-silicon, tungsten, aluminum, copper, gold, silver, tantalum, titanium, molybdenum, cobalt, nickel, platinum, or palladium, an alloy of the conductive material, a conductive nitride of the conductive material, a conductive metal oxide of the conductive material, a conductive silicide of the conductive material, or carbon. A cross-sectional plane of the at least one via electrodes may have a circular shape, an elliptical shape, a polygonal shape, or a combination thereof in a direction parallel to a main surface of the semiconductor substrate.

The N-type region may include a highly-doped impurity region, which has an impurity concentration higher than that of the semiconductor substrate and has a first depth. Furthermore, the N-type region may further include a lightly-doped impurity region, which is arranged below the highly-doped impurity region, has an impurity concentration lower than that of the highly-doped impurity region, and has a second depth greater than the first depth.

The N-type region may be shared by at least two via electrodes. The N-type region may be formed at a bottom surface of the semiconductor substrate.

The bias voltage may have a voltage level such that a parasitic PN diode formed between the semiconductor substrate and the N-type region has reverse driving mode. Signals flowing in the via electrodes may be 0V voltage signals or positive voltage signals, and the power circuit may be grounded.

The N-type region may partially surround a portion of a sidewall of the dielectric layer. Furthermore, the at least one via electrode and the integrated circuits may share the active region. The dielectric layer may include a silicon oxide layer or a high-k thin-film.

According to another aspect of the present invention, there is provided a method of fabricating a semiconductor device, the method including providing a semiconductor substrate having a P-type region; forming an N-type region in the semiconductor substrate; forming a via hole, which contacts the N-type region in the depthwise direction of the semiconductor substrate from a surface of the semiconductor substrate; forming a dielectric layer on an inner sidewall of the semiconductor substrate exposed in the via hole; and forming a via electrode on the dielectric layer to fill the via hole.

Forming the N-type region may include forming a highly-doped impurity region with a first depth, the N-type region having an impurity concentration higher than an impurity concentration of the P-type region of semiconductor substrate. Furthermore, forming the N-type region may include forming a lightly-doped impurity region below the highly-doped impurity region, the lightly-doped impurity region having an impurity concentration lower than an impurity concentration of the highly-doped impurity region and having a second depth greater than the first depth.

Forming the N-type region may be performed simultaneously with forming impurity regions for forming the integrated circuits. The dielectric layer may include a silicon oxide layer or a high-k thin-film. Forming the via hole may be performed by punching the N-type region formed in the semiconductor substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1A:
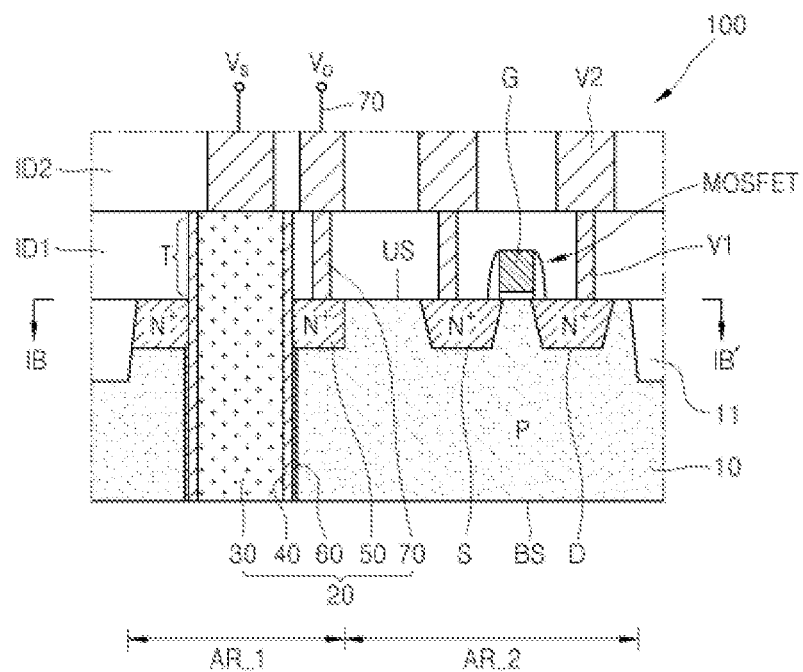
FIG. 1A is a sectional view of a semiconductor device including a through via structure according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, elements, and/or components, but do not preclude the presence or addition of one or more other features, integers, steps, operations, elements, components, and/or groups thereof.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Furthermore, a structure or a form shape "adjacent to" other shape may overlap the adjacent shape or be arranged below the adjacent shape.

The relative terms including "below," "above," "upper," "lower," "horizontal," and "vertical" may be used to describe a relationship between an element, a layer, or a region and another element, another layer, or another region as shown in the drawings. It should be understood that the terms are not limited to the orientations shown in the drawings.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements.

Figure 1B:
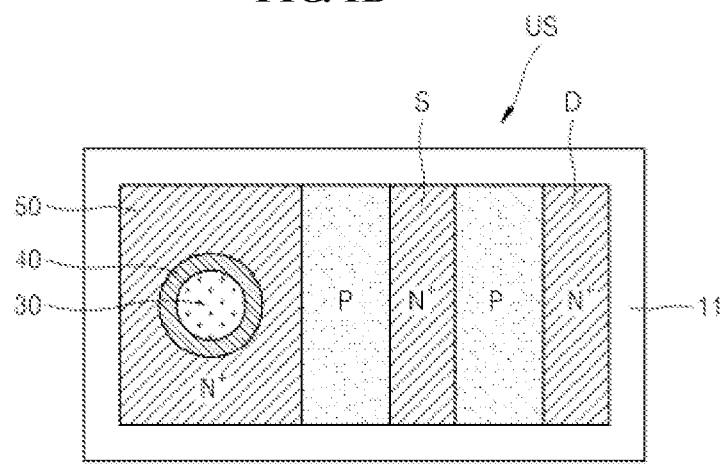
FIG. 1B is a plan view of the top major surface of a semiconductor substrate, taken along a line IB-IB' of FIG. 1A.

FIG. 1A is a sectional view of a semiconductor device 100 including a through via structure 20 according to an embodiment of the present invention, and FIG. 1B is a plan view of the top major surface US of a semiconductor substrate 10, taken along a line IB-IB' of FIG. 1A.

Referring to FIG. 1A, the semiconductor device 100 includes the through via structure 20 inserted into the semiconductor substrate 10. The semiconductor substrate 10 may be a semiconductor layer formed on a base structure, such as a silicon, a silicon-on-insulator (SOI) and a silicon-on-sapphire (SOS), or a non-semiconductor base structure, a lattice-deformed semiconductor layer, or other suitable semiconductor substrates, e.g., composite substrate in which different substrates are bonded. Materials constituting the semiconductor substrate or the semiconductor layer are not limited to silicon-based materials and may include group III-V semiconductor materials, such as silicon-germanium, germanium, and gallium arsenide compound materials, group II-VI semiconductor materials, such as ZnS, ZnSe, and CdSe, oxide semiconductor materials, such as ZnO, MgO, and $MO_2$, nano-scale materials, such as carbon nano-crystals, or composite materials thereof.

The semiconductor substrate 10 may have P-type conductive region. Here, the p-type conductive region of the semiconductor substrate 10 may be provided with a P type conductive bulk semiconductor substrate, or an N type conductive or intrinsic bulk semiconductor substrate having a P-type conductive impurity region, such as P-type wells, pockets, halos or a combination thereof.

The through via structure 20 inserted into the semiconductor substrate 10 may be formed in an active region defined by a device separating film 11, e.g., a shallow trench insulator (STI), a local oxidation of silicon (LOCOS), or a selective poly-silicon oxidation (SEPDX). FIG. 1A shows that the through via structure 20 is formed in a first active region AR_1.

An integrated circuit may be formed at a second active region AR_2 that is adjacent to the first active region AR_1. As shown in FIG. 1A, the integrated circuit may include a metal oxide semiconductor filed effect transistor (MOSFET), which includes a source S and a drain D provided by impurity regions formed in the semiconductor substrate 10 and a gate G formed between the source S and the drain D. The MOSFET may be a PMOS transistor, an NMOS transistor, or CMOS transistor. However, the present invention is not limited thereto.

In an example of the present invention, the MOSFET may have a lightly doped drain (LDD) structure or a double diffused drain structure added by additional impurity regions. Furthermore, the MOSFET may include not only a flat channel, but also a recessed channel or a fin channel for resolving short channel effect. The integrated circuit may include active devices, such as a bipolar transistor and a diode, or passive devices, such as a capacitor, a resistor, or an inductor. The integrated circuits may constitute digital and/or analog circuits suitable for embodying a memory device, such as a DRAM, a logic device, such as a FPGA, a communication device, such as a modem, or a system-on-chip (SOC) in which the above-stated devices are compositely arranged.

In an example of the present invention, as shown in FIG. 1A, the first active region AR_1 in which the through via structure 20 is formed and the second active region AR_2 in which the integrated circuit is formed may be common regions defined by the same device separating film 11. In other example of the present invention, the first active region AR_1 and the second active region AR_2 may be independent active regions separated from each other by a device separating film (not shown).

In an example of the present invention, the first active region AR_1 may be arranged at edge portions of the semiconductor substrate 10. Furthermore, the plurality of through via structures 20 may be either respectively provided in independent active regions defined by the device separating film 11 or provided such that at least some of the plurality of through via structures 20 share one active region.

Each of the through via structures 20 may include a via electrode 30 which extends in the semiconductor substrate 10. The via electrode 30 may extend from one main surface of the semiconductor substrate 10, e.g., the top main surface US, to another main surface of the semiconductor substrate 10, e.g., the bottom main surface US. The via electrode 30 may include a doped poly-silicon; tungsten, aluminum, copper, gold, silver, tantalum, titanium, molybdenum, cobalt, nickel, platinum, or palladium; an alloy thereof; a conductive nitride thereof; a conductive metal oxide thereof; or a compound including silicon and one from among the above-stated metals. However, those are merely examples, and the via electrode 30 may include any of various other conductive materials, e.g., a carbon electrode or any of various other conductive materials for reducing threshold voltage. Referring to FIG. 1B, the via electrode 30 may have a circular cross-section in a direction parallel to a main surface of the semiconductor substrate 10. However, it is merely an example, and the via electrode 30 may have any of various cross-sectional shapes, such as arbitrary polygons or curved shapes, e.g., an ellipse, a rectangle, a rhombus, a hexagon, or a combination thereof, in order to use changes of threshold voltage corresponding to trap concentration change which originates from a crystal direction of a surface of semiconductor substrate which faces with the via electrode 30. Furthermore, the via electrode 30 may have a stripe-like shape extending across an active region.

A dielectric layer 40 surrounding sidewalls of the via electrode 30 is provided between the via electrode 30 and the semiconductor substrate 10. The dielectric layer 40 may include a first potion and a second portion. The first portion of the dielectric layer 40 may contact N-type region 50 formed in the semiconductor substrate 10. The N-type region 50 will be described in detail below. The second portion of the dielectric layer 40 may face with the p-type conductive region of the semiconductor substrate. In the FIG. 1A, the second portion of the dielectric layer 40 is in contact with the p-type semiconductor substrate 10.

The dielectric layer 40 not only electrically isolates the via electrode 30, but also strongly capacitive—couples the via electrode 30 and a surface of the p type region of the semiconductor substrate 10 facing the second portion of the electric layer 40 such that electric signals flowing in the via electrode 30 generate an inversion layer 60 formed from minority carriers of the p type region of the semiconductor substrate 10. In an example of the present invention, according to a fabrication process of the dielectric layer 40, the dielectric layer 40 may pass the top main surface US of the semiconductor substrate 10 and extend to interlayer insulation layer ID1 (portion T) or ID2.

The dielectric layer 40 may include a silicon oxide film. In other example of the present invention, the dielectric layer 40 may include a high-k thin-film, e.g., a silicon nitride film like $Si_3N_4$, or a metal oxide film, e.g., $Al_2O_3$, $Ta_2O_5$, $HfO_2$, $ZrO_2$, $TiO_2$, $Y_2O_3$, $La_2O_3$, $(Ba, Sr)TiO_3$, $SrTiO_3$, $PbTiO_3$, $(Hf,Zr)O_2$, $Pb(Zr,Ti)O_3$, $BaTiO_3$, $SrBi_2Ta_2O_9$, $KxWO_3$, or $Bi_4Ti_3O_{12}$. In case of the high-k thin-film, the via electrode 30 and a surface of the semiconductor substrate 10 facing the via electrode 30 may be strongly capacitive-coupled, thereby further increasing carrier concentration of the inversion layer 60 described below. As a result, shielding capability for reducing interferences or noises due to electric signals flowing in the via electrode 30 may be further enhanced.

The through via structure 20 may further include a N-type region 50 which has a conductive type opposite to conductive type, for example, P-type region of the facing semiconductor substrate 10, and a power circuit 70 coupled with the N-type region 50. The N-type region 50 contacts some portion of sidewall of the dielectric layer 40 and exposes at least the other portion, for example, the second portion of the sidewall of the dielectric layer 40. In an example of the present invention, the N-type region 50 may completely surround an end of the sidewall of the dielectric layer 40, that is, the upper sidewall of the dielectric layer 40, as shown in FIG. 1B.

In an example of the present invention, the N-type region 50 may be formed throughout an active region defined by the device separating film 11, and therefore, may have a same shape as the active region. In other example of the present invention, the N-type region 50 may not only have a rectangular shape, but also a circular or elliptical shape or any of various other polygonal shapes, such as a rhombus-like shape or a rectangular shape, surrounding the via electrode 30. In another example of the present invention if a plurality of through via structures are formed in the semiconductor substrate 10, two or more through via structures adjacent to one another may share one N-type region.

As shown in FIG. 1A, the N-type region 50 is N-type impurity region opposite to impurity region of the semiconductor substrate 10 which is P-type conductive. The N-type region 50 may have a higher impurity concentration than that of the semiconductor substrate 10. The impurity concentration may be changed to modulate shielding capability of a through via structure.

According to an embodiment of the present invention, since the through via structure 20 is formed in an active region, the N-type region 50 may be formed simultaneously as an integrated circuit is formed in an active region of the semiconductor substrate 10. For example, in the example shown in FIG. 1A, the N-type region 50 may be simultaneously formed via an ion implantation and a heat treatment for forming the source S and the drain D of an N-type MOSFET. In this case, the N-type region 50 may have the same impurity concentration and depth as the source S and the drain D of the N-type MOSFET. In another example of the present invention, the N-type region 50 may be simultaneously formed via an ion implantation and a heat treatment for forming buried impurity regions of an adjacent integrated circuit, e.g., the source S and the drain D of a MOSFET, cathode/anode of a diode, halos, pockets, or wells.

The N-type region 50 is connected to the power circuit 70 and may function as a source of minority carriers, for example, electrons for forming an inversion layer on a pacing surface of the semiconductor substrate 10 that is capacitive-coupled with the via electrode 30 by applying a suitable bias voltage Vo or making a ground. In an example of the present invention, if the bias voltage Vo is not a ground voltage or the bias voltage Vo is not 0V, the bias voltage Vo may have a suitable voltage level selected such that a parasitic PN diode formed between the semiconductor substrate 10 and the N-type region 50 has a reverse driving mode. For example, in an example in which the semiconductor substrate 10 is P-type conductive and the N-type region 50 has a conductive type opposite to that of the semiconductor substrate 10, the bias voltage Vo may have a positive value and the semiconductor substrate 10 may be grounded.

Figure 3A:
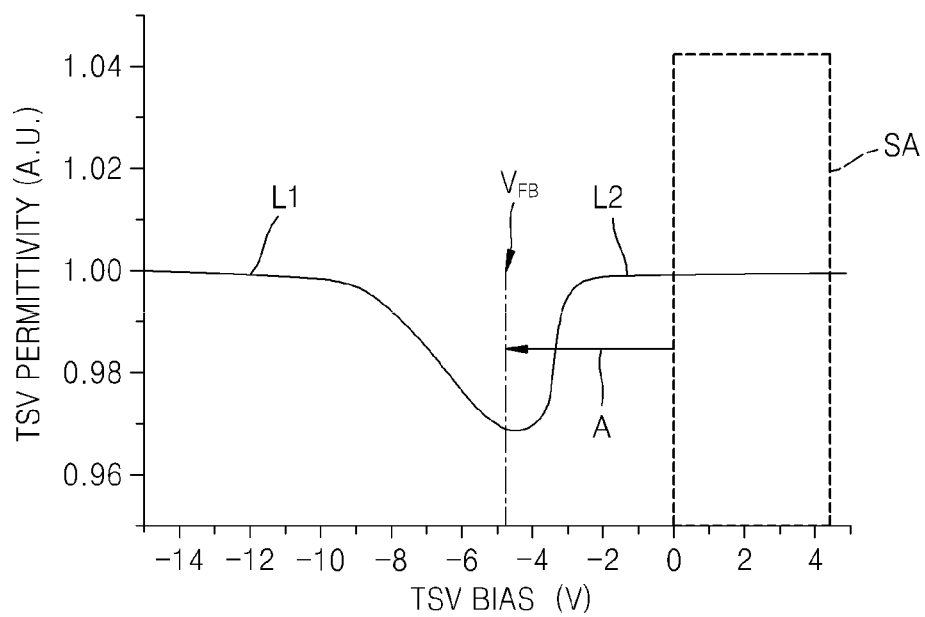
FIG. 3A is a graph showing C-V characteristics of a through via structure as shown in FIG. 2.

As at least a portion of sidewall of the dielectric layer 40 which does not contact the N-type region 50 and therefore is exposed with a facing surface of semiconductor substrate 10 such that the facing surface of the semiconductor substrate 10 is capacitive-coupled with electric signals flowing in the via electrode 30 via the dielectric layer 40, the inversion layer 60 may be formed. The inversion layer 60 may be automatically induced either as electric signals flowing in the via electrode 30 by a bias voltage of the power circuit 70 exceeds a threshold voltage or even if the power circuit 70 is a grounded circuit as illustrated by FIG. 3A. In this case, complicated circuits, such as a separate voltage generating circuit or a charge pump for generating a bias voltage, may not be required. As a result, the through via structure 20 is simplified, and thus density of integration of a semiconductor device may be improved. Furthermore, since the inversion layer 60 is provided by capacitive-coupling by the via electrode 30 and the N-type region 50 contacting the via electrode 30, other reference voltages applied to the semiconductor substrate 10 are not interfered.

In an example of the present invention, the power circuit 70 for electric connection of the N-type region 50 may include contacts or vias directly contacting a surface of the N-type region 50 exposed on the main surface US of the semiconductor substrate 10. The contacts or vias may have similar configurations as contacts V1 and vias V2 penetrating interlayer insulation layers ID1 and ID2 for wiring an adjacent MOSFET or may be simultaneously formed with the contacts V1 and vias V2. Although not shown, the contacts V1 or the vias V2 of the power circuit 70 may be connected to other integrated circuits within a same chip, external circuits (e.g., other semiconductor devices), carrier substrates, or lead frames via conductive members, such as multilayer wirings, redistribution-wirings, pads, or solder balls.

Figure 2:
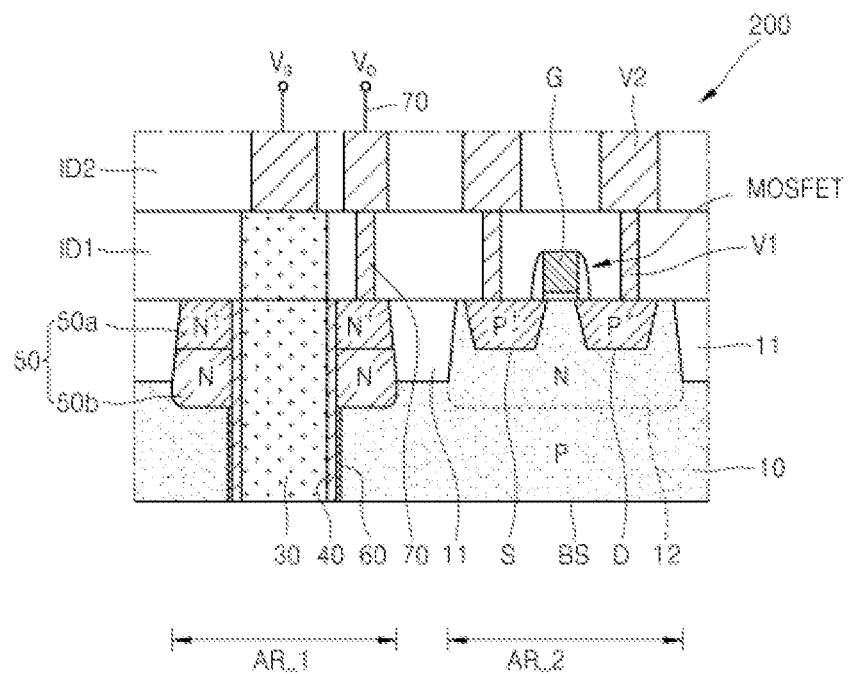
FIG. 2 is a sectional view of a semiconductor device including a through via structure according to another embodiment of the present invention.

FIG. 2 is a sectional view of a semiconductor device 200 including a through via structure according to other example of the present invention. Elements in the FIG. 2 denoted by the same reference numerals as shown in FIGS. 1A and 1B may be explained similarly or identically by the descriptions given above unless there is a contradiction.

Referring to FIG. 2, the dielectric layer 40 of the semiconductor device 200 may be locally formed in the semiconductor substrate 10 only, unlike in the semiconductor device 100 as shown in FIG. 1A. The difference may be embodied based on a method of fabricating the dielectric layer 40. For example, if the dielectric layer 40 is formed by a thermal oxidization, the dielectric layer 40 having the structure as shown in FIG. 2 may be obtained. On the contrary, if the dielectric layer 40 is formed by a chemical vapor deposition, the dielectric layer 40 having the structure as shown in FIG. 1A may be obtained.

Furthermore, the semiconductor device 200 may include a first impurity region 50a and a second impurity region 50b as the N-type region 50 for the inversion layer 60. The first impurity region 50a may be a heavily-doped N-type impurity region (50 of FIG. 1) having an impurity concentration higher than the P-type impurity concentration of the semiconductor substrate 10 as described above with reference to FIG. 1A. The second impurity region 50b may be a lightly-doped N-type impurity region having an impurity concentration lower than that of the first impurity region 50a and a depth greater than that of the first impurity region 50a. The impurity concentration of the second impurity region 50b may be smaller than, equal to, or greater than that of the semiconductor substrate 10.

Increase in the threshold voltage for inducing an inversion layer of the through via structure 20 may be caused from adjacent impurity regions of the semiconductor substrate 10, such as P halos, p pockets, or P wells which are used for resolving problems, such as a leakage current due short channel effect or a parasitic device of an integrated circuit in the semiconductor substrate 10. The second impurity region 50b having a lower impurity concentration than the first impurity region 50a may suppress the increase in the threshold voltage.

In an example of the present invention, a second impurity region 50b may be simultaneously formed with a forming of a second conducting well region 12. A second impurity region 50b may be simultaneously formed by an ion implantation for forming N wells for forming a P type MOSFET. In this case, the second impurity region 50b may have concentration and depth of impurity which are identical to those of the N wells. In other example, the N-type second impurity region 50b may be simultaneously formed by an ion implantation for forming impurity regions of an adjacent integrated circuit, e.g., cathode/anode of a diode, halos, pockets, wells, or buried impurity regions.

Figure 3B:
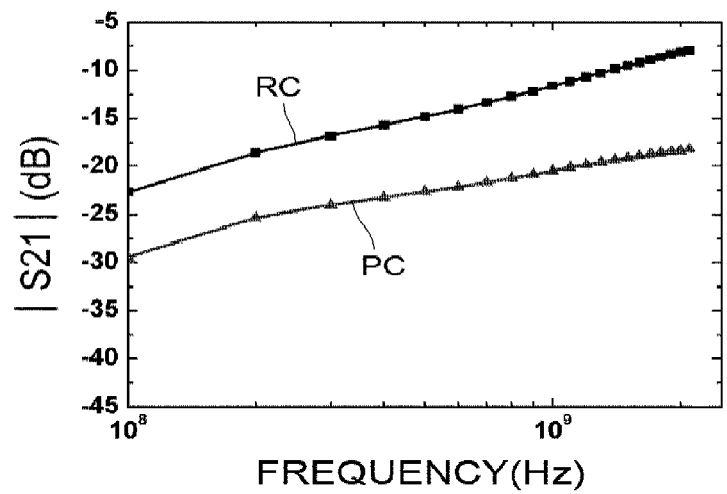
FIG. 3B is a graph showing a result of simulation for analyzing shielding capabilities of the through via structure and a through via structure according to a comparative embodiment.

FIG. 3A is a graph showing C-V characteristics of a through via structure as shown in FIG. 2, and FIG. 3B is a graph showing a result of simulation for analyzing shielding capabilities of the through via structure of the present invention and a through via structure according to a comparative embodiment.

In a through via structure according to an embodiment of the present invention, the via electrode 30, the dielectric layer 40, the N-type region 50, and a surface of the semiconductor substrate 10 facing the exposed dielectric layer 40 may correspond to a gate electrode, a gate insulation layer, a source or drain, and a channel of a general field-effect transistor, respectively. Therefore, the characteristics of through via structure may be emulated as characteristics of a field-effect transistor. The graph of FIG. 3a shows a result of 3-terminal MOS capacitance measurement for measuring permittivity by respectively corresponding the via electrode 30 formed of copper (Cu), the N-type region 50, and the P-type semiconductor substrate 10 to a gate, a source, and a substrate of an N-type MOSFET, and then applying an AC voltage (TSV voltage) to the through via structure 20, and grounding the N-type region 50 and the semiconductor substrate 10. Frequency of the AC voltage is 1 MHz, the through via structure 20 is a SiO$_2$ layer, and a relative permittivity is 3.9. Furthermore, impurity concentrations of the N-type first and second impurity regions 50a and 50b and the P-type semiconductor substrate 10 are 1×10$^{17}$, 1×10$^{12}$, and 1×10$^{15}$ cm$^{-3}$, respectively.

Referring to FIG. 3A, the flat bands voltage is shifted from 0V to the left as indicated with the arrow A and becomes about −8V, where the threshold voltage is about −3.5V. A curve L1 left to the flat bands voltage indicates capacitance change on a surface of a semiconductor substrate facing an exposed surface of a dielectric layer in an accumulation mode for holes which are majority carriers, whereas a curve L2 right to the threshold voltage indicates capacitance change on the surface of the semiconductor substrate in an inversion mode for electrons which are minority carriers.

Referring to FIG. 3A, since the threshold voltage is shifted toward the negative voltage, the through via structure always operates in an inverse mode in which the through via structure is charged with electrons, at TSV bias voltages equal to or greater than 0V. It is supposed that the shift of the threshold voltage occurs due to fixed charges existing at the dielectric layer and/or the interface between the dielectric layer and the semiconductor substrate facing the dielectric layer. The fixed charges may be formed due to defects that may be generated during an etching process for forming via holes or a process for forming the dielectric layer as described below.

As described above, in a through via structure emulated as a MOSFET, threshold voltage for inversing conductive type of a surface of a semiconductor substrate facing a dielectric layer is reduced, where the threshold voltage may be 0V or below. In this case, if electric signals flowing in a via electrode is within the voltage region of the rectangular region SA indicated with a dotted line, that is, the electric signals have voltages equal to or greater than 0V, an inversion layer may be automatically induced on the facing surface of the semiconductor substrate due to electric signals having any of various waveforms, such as pulses, direct current signals, and alternated current signals, and, then, the via electrode may be shielded by the inversion layer.

The curve PC of FIG. 3B is obtained by measuring voltages of surrounding active regions by applying alternated current electric signals to the via electrode. For the measurement, the alternated current electric signals is selected from the range for reverse mode operation with respect to an N-type region and a P-type semiconductor substrate. In addition, for the measurement, the via electrode of the through via structure is treated as a first terminal, and the active regions of the semiconductor substrate around the through via structure is treated as second terminals. From among S-parameters, S21 denotes the forward transfer coefficient. The greater the S21 is, the more efficiently the voltage of a via electrode is transmitted to the surrounding active regions of the semiconductor substrate.

As a comparative embodiment, a through via structure, which has no N-type region and has only a dielectric layer, is fabricated and the forward transfer coefficient thereof is obtained by applying the same electric signals to via electrodes thereof as the through via structure of the present invention. The curve RC shows a result of emulation related to the comparative embodiment.

Comparing the curve PC of the through via structure according to an embodiment of the present invention to the curve RC of the through via structure according to the comparative embodiment, the transfer coefficient |S21| becomes greater as frequencies of voltages applied to via electrodes increase. As a result, transmitted noises increase as frequencies of signals flowing in the via electrodes may increase, and interferences to adjacent integrated circuits may be intensified. However, compared to the through via structure according to the comparative embodiment, in the through via structure according to an embodiment of the present invention, the transfer coefficient is reduced by about 80% (based on dB), and thus the through via structure effectively suppresses or reduces interferences to adjacent integrated circuits.

Figure 4:
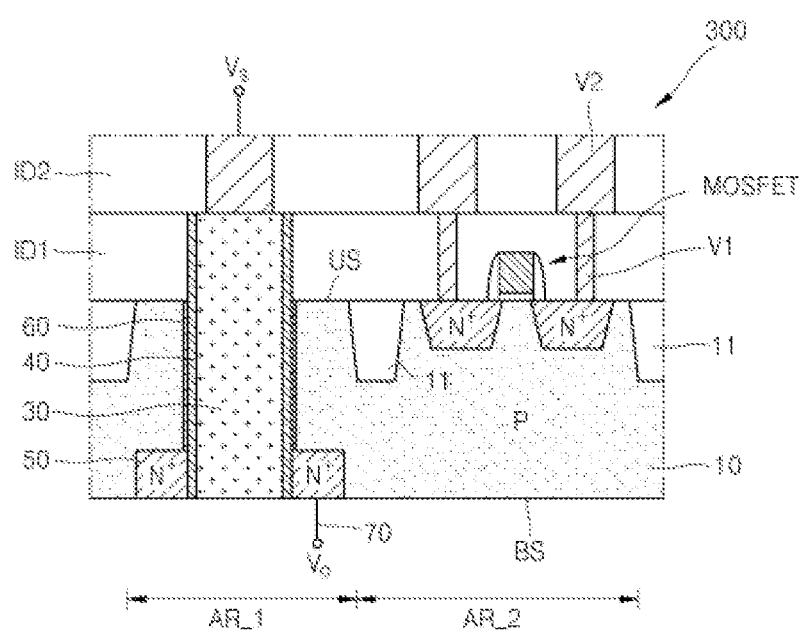
FIG. 4 is a sectional view of a semiconductor device including a through via structure according to another embodiment of the present invention.

FIG. 4 is a sectional view of a semiconductor device 300 including a through via structure according to another example of the present invention. Elements in the FIG. 4 denoted by the same reference numerals as shown in FIGS. 1A to 2 may be explained similarly or identically by the descriptions given above unless there is a contradiction.

Referring to FIG. 4, in the semiconductor device 300, the N-type region 50 of the through via structure may be formed at a main surface BS of a semiconductor substrate opposite to the main surface US on which an integrated circuit (e.g., a MOSFET) is formed. Furthermore, the first active region AR_1 in which the through via structure is formed and the second active region AR_2 in which the MOSFET is formed may be separated from each other by the device separating film 11. However, it is merely an example, and the through via structure and the integrated circuit may share one of active region as described above with reference to FIG. 1A.

The N-type region 50 of the through via structure is connected to a bias voltage by the power circuit 70 or grounded. The N-type region 50 may preferably be grounded. In a surface of the semiconductor substrate 10, which faces at least another sidewall of the dielectric layer 40 which does not contact the N-type region 50 and are exposed with respect to the semiconductor substrate 10, the surface of the semiconductor substrate 10 is coupled with electric signals flowing in the via electrodes 30 by the dielectric layer 40 and the inversion layer 60 may be formed on the surface of the semiconductor substrate 10. The inversion layer 60 will extend from the N-type region 50 toward the top main surface US of the semiconductor substrate 10.

According to other example of the present invention, as described above with reference to FIG. 2, the N-type region 50 may include an N-type heavily-doped impurity region (50a of FIG. 2) and a lightly-doped impurity region (50b of FIG. 2). The lightly-doped impurity region (50b) has the same conductive type as the first impurity region 50a, and a lower impurity concentration than the first impurity region 50a. In addition, the lightly-doped impurity region (50b) may contacts the first impurity region 50a and has a relatively large depth by being further extended toward the top main surface US of the semiconductor substrate 10. The N-type region 50 may be formed via a suitable ion implantation and heat treatment for activating the region 50 may be performed.

Figure 5A:
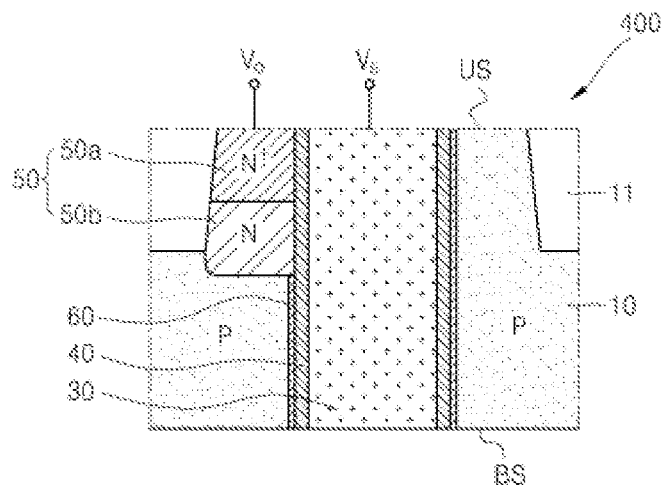
FIG. 5A is a sectional view of a semiconductor device including a through via structure according to another embodiment of the present invention.
Figure 5B:
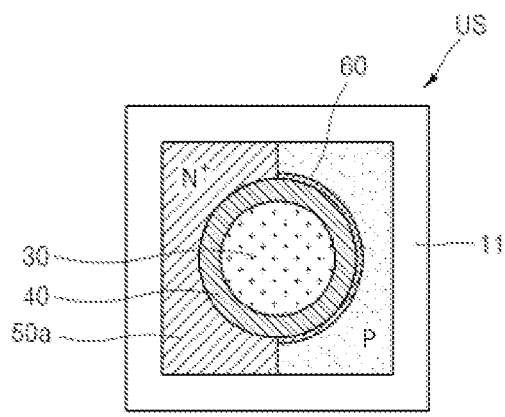
FIG. 5B is a plan view of the top main surface of the semiconductor substrate of FIG. 5A.

FIG. 5A is a sectional view of a semiconductor device 400 including a through via structure according to another example of the present invention, and FIG. 5B is a plan view of the top main surface US of the semiconductor substrate 10 of FIG. 5A. Elements in the FIGS. 5A and 5B denoted by the same reference numerals as shown in FIGS. 1A to 4 may be explained similarly or identically by the descriptions given above unless there is a contradiction.

Referring to FIG. 5A, the N-type region 50 of the through via structure may surround only a portion of the dielectric layer 40 at a level at which the N-type region 50 contacts sidewalls of the dielectric layer 40 surrounding the through via structure 20. For example, the N-type region 50 of the through via structure may surround only a portion of the upper sidewall of the dielectric layer 40.

In the through via structure, the inversion layer 60 which is induced by being coupled with electric signals flowing in the via electrode 30 may not only extend from an edge of the N-type region 50 toward the bottom main surface BS of the semiconductor substrate 10 along the dielectric layer 40, but also extend toward the top main surface US of the semiconductor substrate 10 along another exposed surface of the dielectric layer 40 not contacting the N-type region 50, as shown in FIG. 5B. The technical features described above with reference to FIG. 5A may also be applied to the other examples described above with reference to FIGS. 1A through 4.

FIGS. 6A through 6G are sectional views sequentially showing a method of fabricating a semiconductor device having a through via structure according to an example of the present invention. Elements in these drawings denoted by the same reference numerals as shown in FIGS. 1A to 5B may be explained similarly or identically by the descriptions given above unless there is a contradiction.

Figure 6A:
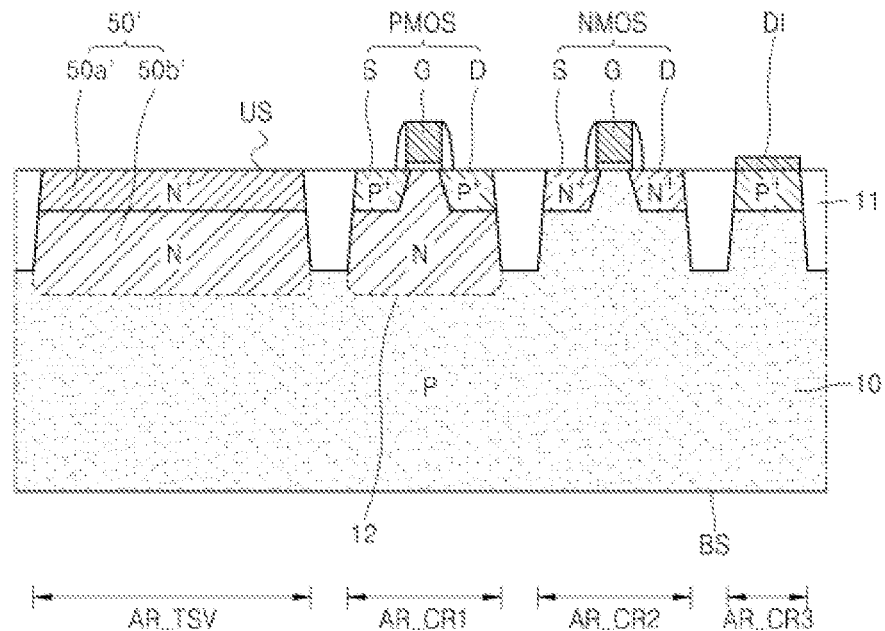
FIGS. 6A through 6G are sectional views sequentially showing a method of fabricating a semiconductor device having a through via structure according to an embodiment of the present invention.

Referring to FIG. 6A, the device separating film 11 is formed on the P-type semiconductor substrate 10, thereby defining active regions AR_TSV, AR_CR1, AR_CR2, and AR_CR3. From among the active regions, a first active region AR_TSV is a region in which the through via structure is formed, whereas second regions AR_TSV, AR_CR1, AR_CR2, and AR_CR3 are regions in which integrated circuits are formed. In an example of the present invention, at least some of the first active regions and the second active regions may share active regions without being separated by a device separating film.

The integrated circuits may include active devices, such as MOSFETs (PMOS, NMOS) and diodes DI, or passive devices, such as resistors and capacitors, although not shown. The integrated circuits may be formed via semiconductor fabricating techniques, such as ion implantation, thin-film deposition, photolithography, patterning like etching, and/or heat treatment.

An N-type region 50' of the through via structure may be formed on the top main surface US of the semiconductor substrate 10 as shown in FIG. 6A. However, it is merely an example, and an N-type region may be formed on other surface, e.g., the bottom main surface BS of the semiconductor substrate 10 opposite to a main surface of the semiconductor substrate 10 on which the integrated circuits are formed like in the semiconductor device 300 shown in FIG. 4. The N-type region 50' may include a highly-doped N-type region 50a' as described above with reference to FIG. 1. Alternatively, the N-type region 50' may further include a lightly-doped impurity region like the second impurity region 50b' of FIG. 2. In an example of the present invention, the N-type region 50' may be simultaneously formed as impurity regions constituting other integrated circuits on the semiconductor substrate 10 are formed. For example, the highly-doped impurity region 50a' may be simultaneously formed by an ion implantation for forming a source and a drain of an NMOS. The lightly-doped impurity region 50b' may be simultaneously formed by an ion implantation for forming N wells 12 for forming a PMOS. However, the above-stated examples are merely exemplary, and the impurity regions 50a and 50b may be formed by an ion implantation process for forming any of impurity regions for forming integrated circuits, such as pockets, halos, or other buried impurity regions.

Figure 6B:
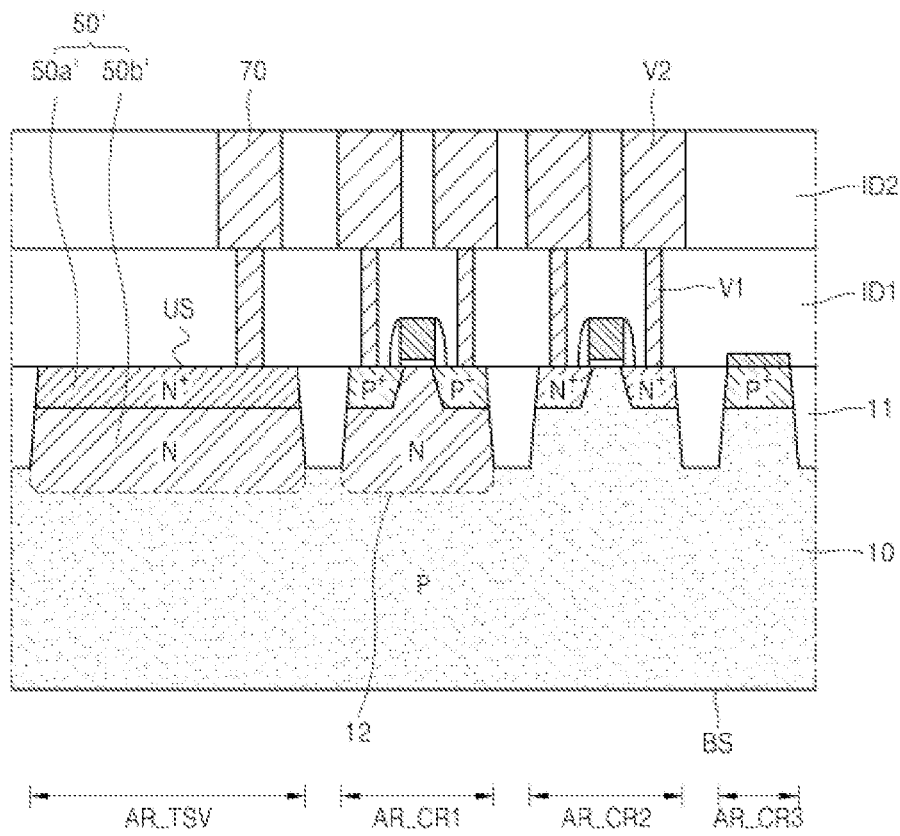

Referring to FIG. 6B, a wiring process is performed on the semiconductor substrate 10 on which the integrated circuits are formed. As known in the art, one or more interlayer insulation layers ID1 and ID2 may be formed on the semiconductor substrate 10 for electric insulation between integrated circuits PMOS, NMOS, and DI, and the contacts V1 or the vias V2 that are buried in the interlayer insulation layers ID1 and ID2 or penetrate the interlayer insulation layers ID1 and ID2, may be formed for electric connections between the integrated circuits PMOS, NMOS, and DI. The power circuit 70 for electric connection of the N-type region 50' having the through via structure as described above may include suitable contacts and/or vias.

Figure 6C:
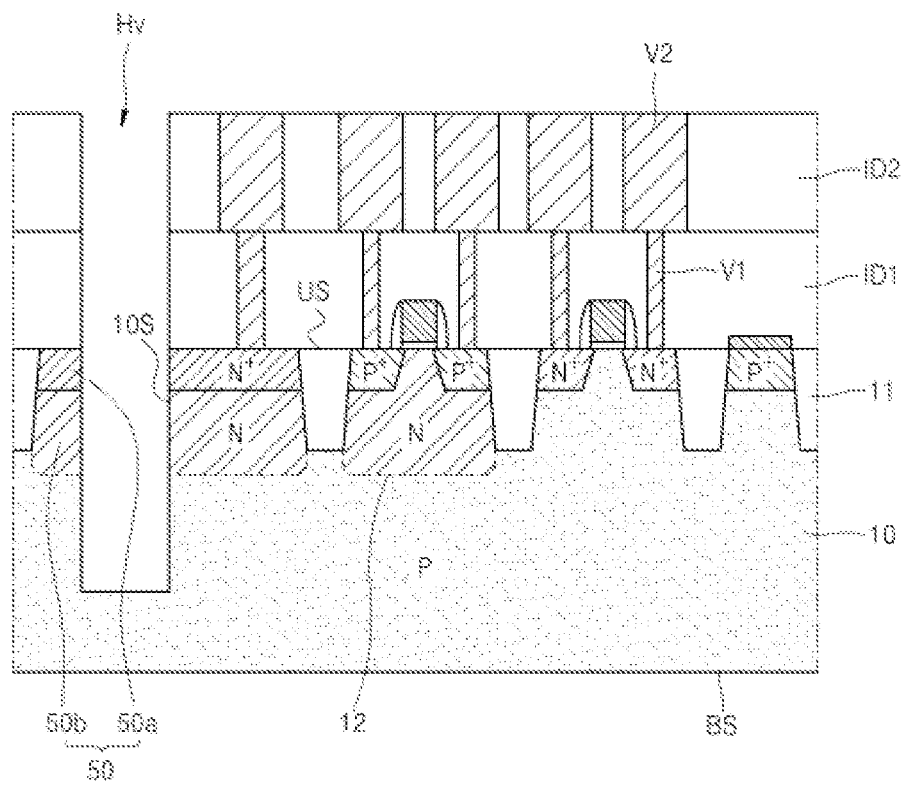

Referring to FIG. 6C, via hole HV is formed from the top main surface US of the semiconductor substrate 10 in the depthwise direction of the semiconductor substrate 10. As described above with reference to FIG. 6B, in a case where a wiring process is performed on the semiconductor substrate 10 and the interlayer insulation layers ID1 and ID2 are formed, the via hole HV may penetrate the interlayer insulation layers ID1 and ID2. The via hole HV may have any cross-sectional shape, e.g., a circular shape, an elliptical shape, a rectangular shape, a rhombus-like shape, a hexagonal shape, etc., that is identical to the horizontal cross-sectional shape of a via electrode to be formed later. In other example of the present invention, the via hole HV is not limited to a hole-based pillar-like shape as described above and may have a trench-like shape. The via hole HV may either partially penetrate in the depthwise direction of the semiconductor substrate 10 as shown in FIG. 6C or may completely penetrate to the bottom main surface BS.

As shown in FIG. 6C, the via hole HV may pass through a portion of the existing N-type region 50 formed in the semiconductor substrate 10. In this case, the via hole HV may be formed by punching the N-type region 50. Alternatively, the via hole HV may not pass through the N-type region 50 and may be formed in the semiconductor substrate 10 with the via hole HV contacting the N-type region 50. The via hole HV may be formed via a dry etching process using plasma or wet etching process. As a result, the N-type region 50 surrounds an at least portion of the via hole HV.

Unlike in the above-disclosed examples, if the via hole HV is formed and, then, the N-type region 50 for a through via structure is formed, it may be difficult or impossible to form the N-type region 50 through the via hole HV by ion implantation. Furthermore, as an alternative to the ion implantation, dopants may be implanted on to-be N-type region 50 of the surface 10S of a semiconductor substrate through the via hole HV by exposing the surface 10S of a semiconductor substrate to a dopant-containing gas atmosphere and performing a heat treatment to the semiconductor substrate 10. However, in this case, it is difficult to locally form N-type regions only on some portion of surfaces of the semiconductor substrate 10 exposed in the via hole HV. Furthermore, considering that such an impurity implantation generally requires a high-temperature heat treatment for activating impurities, performances of integrated circuits PMOS, NMOS, and DI that are already formed on a semiconductor substrate may be affected by the high-temperature heat treatment such that the alternative method described above is practically impossible to be applied to form the N-type region 50. Therefore, preferably as shown in FIG. 6C, the N-type region 50 may be formed first, and then the via hole HV may be formed.

Figure 6D:
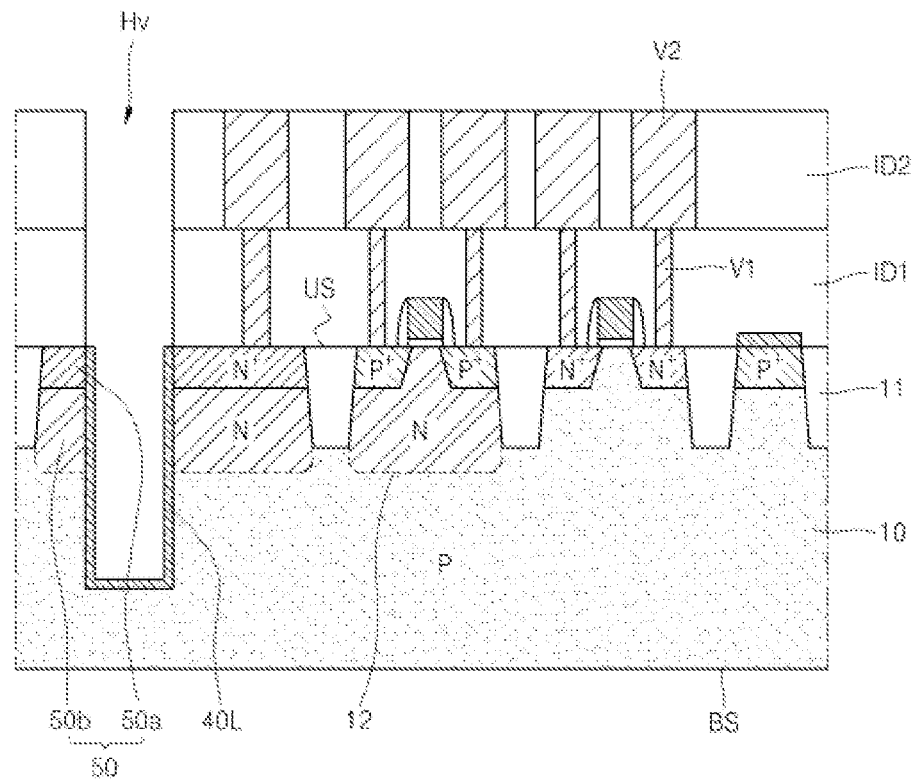

Referring to FIG. 6D, a dielectric layer 40L is formed on an exposed sidewall (10S of FIG. 6C) of the semiconductor substrate 10 exposed in the via hole HV. The dielectric layer 40L may be a thermally oxidized layer, a silicon oxide layer, or a high-k thin-film, such as a silicon nitride (e.g., $Si_3N_4$) layer, or a metal oxide layer, such as an $Al_2O_3$, $Ta_2O_5$, $HfO_2$, $ZrO_2$, $TiO_2$, $Y_2O_3$, $La_2O_3$, $(Ba,Sr)TiO_3$, $SrTiO_3$, $PbTiO_3$, $(Hf,Zr)O_2$, $Pb(Zr,Ti)O_3$, $BaTiO_3$, $SrBi_2Ta_2O_9$, $K_xWO_3$ or $Bi_4Ti3O_{12}$. The dielectric layer materials may be formed by a thin-film deposition process, such as thermal oxidization, chemical vapor deposition, plasma-enhanced chemical vapor deposition, or atomic layer deposition. Preferably, in a case where the dielectric layer 40 is formed after integrated circuits are formed, the dielectric layer 40L may be formed via chemical vapor deposition, plasma-enhanced chemical vapor deposition, or atomic layer deposition, which is performed at a lower temperature compared to the thermal oxidization process. The example shown in FIG. 6D shows the dielectric layer 40L formed by thermal oxidization.

Figure 6E:
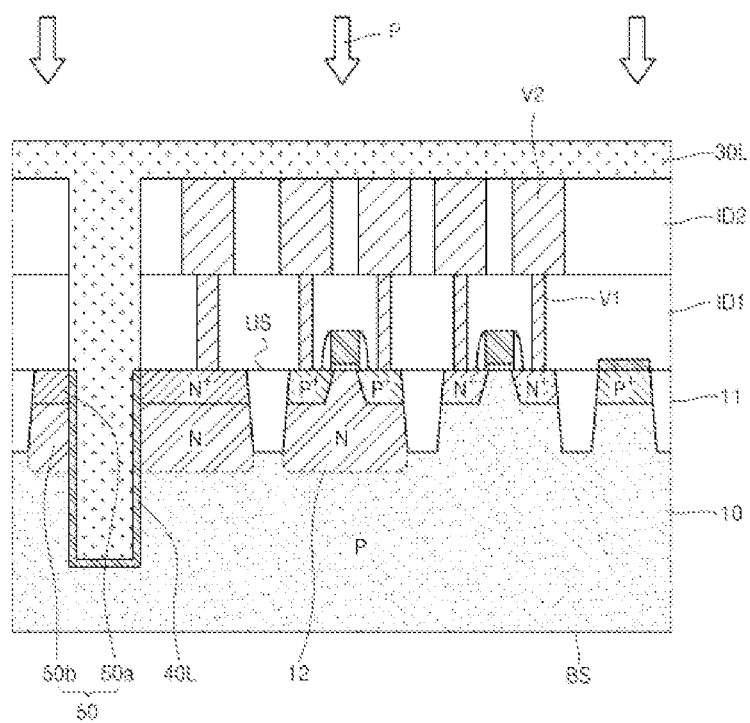

Referring to FIG. 6E, a conductive layer 30L is formed on the dielectric layer 40L to fill the via hole HV. The conductive layer 30L may include a doped poly-silicon; tungsten, aluminum, copper, gold, silver, tantalum, titanium, molybdenum, cobalt, nickel, platinum, or palladium; an alloy thereof; a conductive nitride thereof; a conductive metal oxide thereof; or a conductive silicide thereof. However, those are merely examples, and the conductive layer 30L may include any of other conductive materials, e.g., a carbon electrode or any of various other conductive materials for reducing threshold voltage. The conductive layer 30L may be formed via chemical vapor deposition or physical vapor deposition, electroless plating, electric plating, or a combination thereof.

Figure 6F:
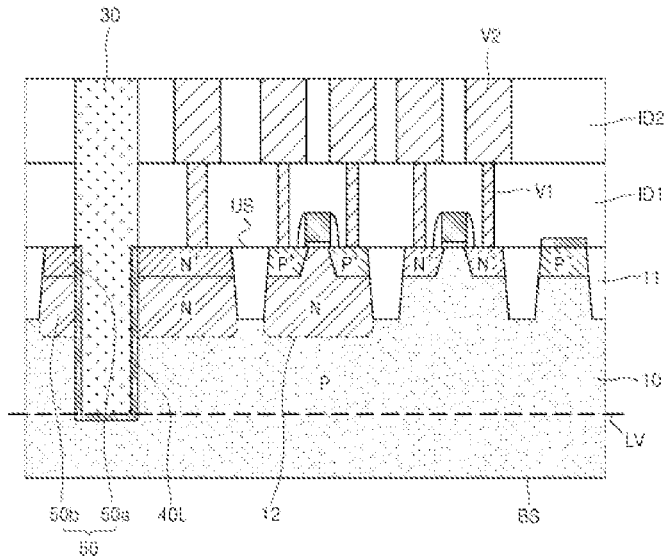
Figure 6F:

Next, as indicated with the arrow P, a planarization process for removing the conductive layer 30L until an underlayer, e.g., the interlayer insulation layer ID2, is exposed, thereby forming the via electrode 30 buried in the via hole HV as shown in FIG. 6F. The planarization process may include chemical mechanical polishing or etchback.

Figure 6G:
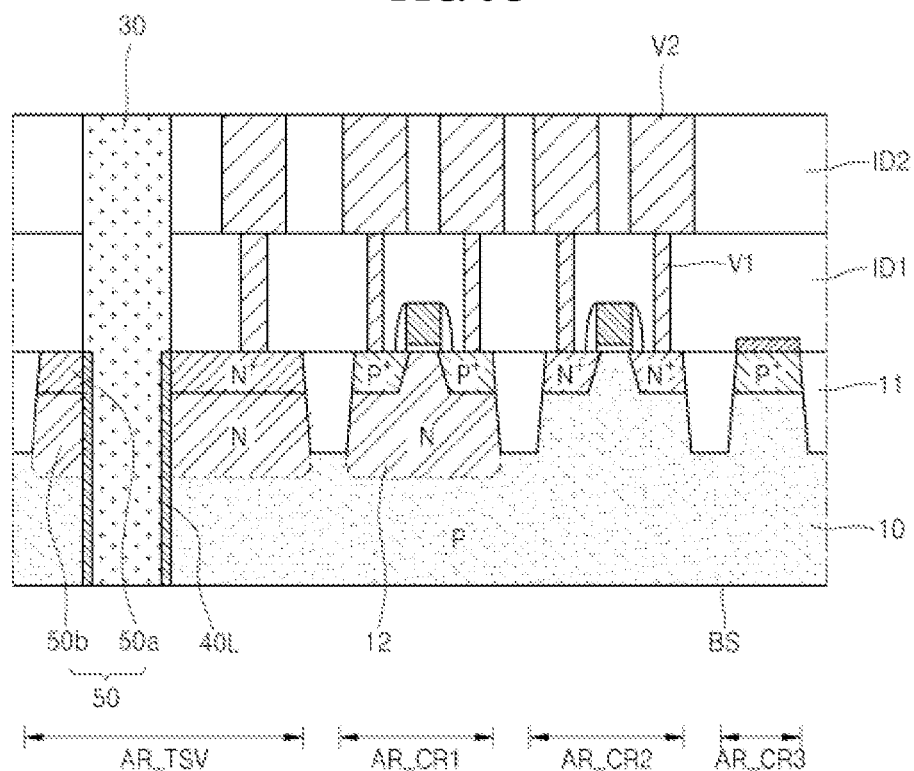

Next, the bottom main surface BS of the semiconductor substrate 10 is recessed to the region indicated with the dotted line LV in FIG. 6F, and thus a through via structure may be formed as shown in FIG. 6G. As described above with reference to FIG. 6C, if the via hole HV completely penetrates to the bottom main surface BS of the semiconductor substrate 10, the recess process may be omitted.

Figure 7:
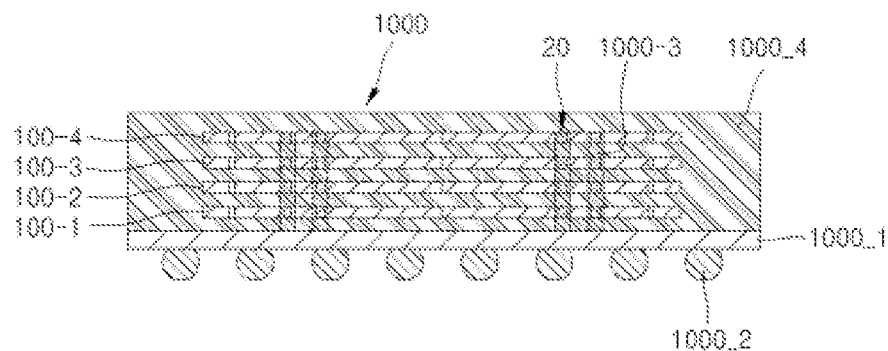
FIG. 7 is a sectional view of a semiconductor device according to an embodiment of the present invention.

FIG. 7 is a sectional view of a semiconductor device 1000 according to an example of the present invention.

Referring to FIG. 7, the semiconductor device 1000 may be a multi-chip package type semiconductor device. A plurality of semiconductor devices 100_1, 100_2, 100_3, and 100_4 (these may be chip-type devices) may be stacked on a carrier substrate 1000_1. The carrier substrate 1000_1 may be a printed circuit board substrate, a lead frame, or a flexible wiring film. However, the present invention is not limited thereto. The carrier substrate 1000_1 may be mounted on another substrate or a socket via external terminals 1000_2, such as solder balls or bumps.

Chips constituting the plurality of semiconductor devices 100_1, 100_2, 100_3, and 100_4 may have a same size. In other example of the present invention, chips constituting the semiconductor devices 100_1, 100_2, 100_3, and 100_4 may have different sizes from one another. In this case, a plurality of small-sized semiconductor chips may be stacked in an in-plane shape on a single large semiconductor chip. Furthermore, all or some of the semiconductor devices 100_1, 100_2, 100_3, and 100_4 may be stacked on the carrier substrate 1000_1, such that top surfaces thereof face upward. Alternatively, all or some of the semiconductor devices 100_1, 100_2, 100_3, and 100_4 may be stacked on the carrier substrate 1000_1 in a flip-chip mode, such that the top surfaces thereof face toward the carrier substrate 1000_1. The semiconductor devices 100_1, 100_2, 100_3, and 100_4 stacked as described above may be protected by a encapsulation resin 1000_4, such as an epoxy.

At least some of the semiconductor devices 100_1, 100_2, 100_3, and 100_4 may include the through via structure 20 according to any of the above-stated examples of the present invention, and electric connections may be established between adjacent semiconductor devices via the through via structure 20. The through via structures 20 adjacent to each other may directly contact each other or may be electrically connected to each other via a medium electrode 1000_3. Clock signals for synchronization between adjacent semiconductor chips, command signals, address signals, or data signals may be transmitted via the through via structures. Furthermore, power and a ground voltage for driving integrated circuits of the semiconductor chips may be provided via the through via structures. Furthermore, wirings, redistribution wirings, pads, or medium electrodes for providing a bias voltage or a ground voltage suitable for N-type regions of the through via structure may be provided.

According to an embodiment of the present invention, electric signals flowing in via electrodes and a surface of a semiconductor substrate facing a sidewall of a dielectric layer are capacitive-coupled with each other by the dielectric layer, and minority carriers are supplied to the surface of the semiconductor substrate 10 by N-type regions. Therefore, an inversion layer may be easily induced without a high voltage. Such an inversion layer may shield via electrodes, thereby minimizing interferences induced to adjacent integrated circuits by noises due to electric signals flowing in the via electrodes.

Furthermore, according to an embodiment of the present invention, a method of fabricating a semiconductor device having the above-stated advantages may be provided.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
   a semiconductor substrate having a P-type region and at least one surface with integrated circuits formed thereon;
   at least one via electrode extending in the semiconductor substrate;
   a dielectric layer formed between the semiconductor substrate and the at least one via electrode, the dielectric layer including a first portion, and a second portion that faces the P-type region of the semiconductor substrate;
   an N-type region formed in the semiconductor substrate to contact the first portion of the dielectric layer; and
   a power circuit, which is electrically connected to the N-type region and applies a bias voltage or a ground voltage thereto, such that electric signals flowing in the via electrodes form an inversion layer on a surface of the p-type region of semiconductor substrate facing the second portion of the dielectric layer.

2. The semiconductor device of claim 1, wherein the P-type region of the semiconductor substrate includes an entire body, wells, pockets, halos, or a combination thereof.

3. The semiconductor device of claim 1, wherein the at least one via electrode is formed in an active region of the semiconductor substrate.

4. The semiconductor device of claim 1, wherein the at least one via electrode includes a conductive material chosen from doped poly-silicon, tungsten, aluminum, copper, gold, silver, tantalum, titanium, molybdenum, cobalt, nickel, platinum, and palladium, an alloy of the conductive material, a conductive nitride of the conductive material, a conductive metal oxide of the conductive material, a conductive silicide of the conductive material, or carbon.

5. The semiconductor device of claim 1, wherein a cross-sectional plane of the at least one via electrode has a circular shape, an elliptical shape, a polygonal shape, or a combination thereof, wherein the cross-sectional plane is parallel to a main surface of the semiconductor substrate.

6. The semiconductor device of claim 1, wherein the N-type region comprises a highly-doped impurity region which has an impurity concentration higher than that of the semiconductor substrate and has a first depth.

7. The semiconductor device of claim 6, wherein the N-type region further comprises a lightly-doped impurity region arranged below the highly-doped impurity region,
wherein the lightly-doped impurity region has an impurity concentration lower than the impurity concentration of the highly-doped impurity region, and
wherein the lightly-doped impurity region has a second depth greater than the first depth.

8. The semiconductor device of claim 1, wherein the N-type region is shared by at least two via electrodes.

9. The semiconductor device of claim 1, wherein the integrated circuits are formed on a top surface of the semiconductor substrate, and
wherein the N-type region is formed at a bottom surface of the semiconductor substrate.

10. The semiconductor device of claim 1, wherein the bias voltage has a voltage level such that a parasitic PN diode formed between the P-type region and the N-type region has a reverse driving mode.

11. The semiconductor device of claim 1, wherein signals present in the at least one via electrode are 0V voltage signals or positive voltage signals, and the power circuit is grounded.

12. The semiconductor device of claim 1, wherein the N-type region partially surrounds a portion of a sidewall of the dielectric layer.

13. The semiconductor device of claim 1, wherein the at least one via electrode and the integrated circuits share the active region.

14. The semiconductor device of claim 1, wherein the dielectric layer comprises a silicon oxide layer or a high-k thin film.

* * * * *